United States Patent
Lee et al.

(10) Patent No.: US 12,122,879 B2
(45) Date of Patent: Oct. 22, 2024

(54) CURABLE RESIN COMPOSITION, THIN FILM, AND COLOR CONVERSION PANEL AND DISPLAY DEVICE INCLUDING THIN FILM

(71) Applicant: Samsung SDI Co., Ltd., Yongin-si (KR)

(72) Inventors: Seungeun Lee, Yongin-si (KR); Hyun-Joo Seo, Yongin-si (KR); Jeehyun Ryu, Yongin-si (KR); Donggyoon Seo, Yongin-si (KR); Minji So, Yongin-si (KR); Dongju Shin, Yongin-si (KR); Sungkeun Lee, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 195 days.

(21) Appl. No.: 17/654,720

(22) Filed: Mar. 14, 2022

(65) Prior Publication Data
US 2022/0306809 A1  Sep. 29, 2022

(30) Foreign Application Priority Data
Mar. 23, 2021 (KR) .................. 10-2021-0037500

(51) Int. Cl.
| | | |
|---|---|---|
| C08K 3/36 | (2006.01) | |
| C08G 77/00 | (2006.01) | |
| C08G 77/06 | (2006.01) | |
| C08J 5/18 | (2006.01) | |
| C08K 7/26 | (2006.01) | |
| G02F 1/1335 | (2006.01) | |
| G03F 7/075 | (2006.01) | |

(52) U.S. Cl.
CPC ............ *C08G 77/06* (2013.01); *C08G 77/70* (2013.01); *C08J 5/18* (2013.01); *C08K 3/36* (2013.01); *C08K 7/26* (2013.01); *G02F 1/133514* (2013.01); *G03F 7/0758* (2013.01); *C08K 2201/005* (2013.01); *C08K 2201/011* (2013.01)

(58) Field of Classification Search
CPC ...................................................... C08G 77/50
See application file for complete search history.

(56) References Cited

U.S. PATENT DOCUMENTS

| | | | | |
|---|---|---|---|---|
| 7,842,753 | B2 * | 11/2010 | Yamaya ............... | G02B 1/045 528/42 |
| 8,273,811 | B2 * | 9/2012 | Tsujimoto ............ | C09D 183/14 524/109 |
| 9,376,589 | B2 * | 6/2016 | Maghsoodi .......... | C09D 173/00 |
| 2005/0131190 | A1 | 6/2005 | Lee et al. | |
| 2007/0243395 | A1 * | 10/2007 | Yamaya ............... | C09D 183/14 528/42 |
| 2009/0043025 | A1 * | 2/2009 | Tsujimoto ............ | C09D 5/1675 524/263 |
| 2017/0096657 | A1 * | 4/2017 | Gosselin ............... | C12N 11/14 |
| 2020/0239732 | A1 | 7/2020 | Shin et al. | |
| 2022/0252769 | A1 | 8/2022 | Lee et al. | |

FOREIGN PATENT DOCUMENTS

| | | |
|---|---|---|
| CN | 1657530 A | 8/2005 |
| CN | 106662672 A | 5/2017 |
| CN | 111279229 A | 6/2020 |
| EP | 3 098 266 A1 | 11/2016 |
| JP | 2006-022314 A | 1/2006 |
| JP | 2006-063300 A | 3/2006 |
| JP | 2006-328419 A | 12/2006 |
| JP | 2014-027262 A | 2/2014 |
| JP | 2016-084267 A | 5/2016 |
| JP | 6501636 B2 | 4/2019 |
| JP | 6617634 B2 | 12/2019 |
| KR | 10-2015-0050470 A | 5/2015 |
| KR | 10-2015-0140223 A | 12/2015 |
| KR | 10-2016-0110394 A | 9/2016 |
| KR | 10-1659709 B1 | 9/2016 |
| KR | 10-2018-0014961 A | 2/2018 |
| KR | 10-2019-0067484 A | 6/2019 |
| KR | 10-2118904 B1 | 6/2020 |
| KR | 10-2020-0141325 | 12/2020 |
| TW | 201402702 A | 1/2014 |
| TW | I634074 B | 9/2018 |
| TW | 202110963 A | 3/2021 |
| WO | 2013/078551 * | 6/2013 |

OTHER PUBLICATIONS

Office Action dated Apr. 19, 2024 of the corresponding Korean Patent Application No. 10-2021-0037500, 9pp.
Malfait, Wim J. et al.; "Surface Chemistry of Hydrophobic Silica Aerogels"; Chemistry of Materials; vol. 27; pp. 6737-6745.

\* cited by examiner

*Primary Examiner* — Margaret G Moore
(74) *Attorney, Agent, or Firm* — Lewis Roca Rothgerber Christie LLP

(57) ABSTRACT

A curable resin composition includes a silicon-containing polymer, hollow silica particles having greater than or equal to two times higher a maximum peak value in a Q4 region than that in a Q3 region, as measured by silicon nuclear magnetic resonance spectroscopy (Si-NMR) analysis. A solvent, a thin film prepared from the composition, and a color conversion panel including the thin film, and a display device including the color conversion panel are also provided.

18 Claims, 3 Drawing Sheets

CURABLE RESIN COMPOSITION, THIN FILM, AND COLOR CONVERSION PANEL AND DISPLAY DEVICE INCLUDING THIN FILM

CROSS-REFERENCE TO RELATED APPLICATION

This application claims priority to and the benefit of Korean Patent Application No. 10-2021-0037500 filed in the Korean Intellectual Property Office on Mar. 23, 2021, the entire content of which is hereby incorporated by reference.

BACKGROUND

1. Field

A curable resin composition, a thin film prepared from the curable resin composition, and a color conversion panel and a display device including the thin film are disclosed.

2. Description of the Related Art

Various display devices have been developed. Among them, self-radiating devices, such as, for example, organic light emitting diode (OLED) or a device including quantum dots, are required to have an improved luminous efficiency. When a low refractive index material is used among various thin films of a panel comprised of a display device, the light lost during transmitted inside a device may be recycled (e.g., reflected) such that luminous efficiency can be increased. Further, as a low refractive index may result low reflection effect, a low refractive index material may be used in a low reflection layer of a lens outside a light sensor or in an outermost anti-reflection (AR) layer of a display or a solar cell.

Recently, as display devises are required to be thinner, lighter, bendable and/or rollable, thin and flexible films are being considered for use to meet the above-described properties. In addition, as the low refractive index of the coating layer is lowered, a thickness of the coating layer may be decreased, and thus a margin of the coating film may become wider and efficiency according to device purposes may be increased. In addition to the consideration of a low refractive index as described above, there are additional considerations of achieving good thermal stability and adhesion, etc., while manufacturing and/or using a display device.

SUMMARY

An embodiment provides a curable resin composition having a low refractive index, a high contact angle to water, and good adhesion to a substrate and/or an adjacent layer.

Another embodiment provides a thin film prepared by curing the curable resin composition.

Further another embodiment provides a color conversion panel including the thin film.

Still further embodiments provide a display device including the color conversion panel.

The features of the subject matter of the present disclosure are not limited to those mentioned above, and other features which are not explicitly mentioned will be clearly understood by a person having an ordinary skill in the art to which the present disclosure pertains from the following descriptions.

(1) In some embodiments, the curable resin composition comprises a silicon-containing polymer, hollow silica particles having greater than or equal to two times higher a maximum peak value in a Q4 region than that in a Q3 region, as measured by silicon nuclear magnetic resonance spectroscopy (Si-NMR) analysis, and a solvent.

(2) The silicon-containing polymer includes a carbosilane-siloxane copolymer represented by Chemical Formula 1:

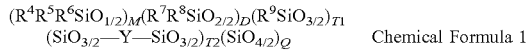

$(R^4R^5R^6SiO_{1/2})_M(R^7R^8SiO_{2/2})_D(R^9SiO_{3/2})_{T1}$
$(SiO_{3/2}\text{—}Y\text{—}SiO_{3/2})_{T2}(SiO_{4/2})_Q$  Chemical Formula 1

In Chemical Formula 1,
$R^4$ to $R^9$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 heteroalkyl group, a substituted or unsubstituted C6 to C30 aryl group, a substituted or unsubstituted C3 to C30 cycloalkyl group, a substituted or unsubstituted C2 to C30 heterocycloalkyl group, a substituted or unsubstituted C1 to C30 alkoxyl group, carboxyl group, R(C=O), R(=O)O— (wherein, R is hydrogen, a C1 to C30 alkyl group, a C3 to C30 cycloalkyl group, a C6 to C30 aryl group, or a combination thereof), an epoxy-containing monovalent organic group, a (meth)acrylic group, a (meth)acrylate group, or a combination thereof, Y is a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a combination thereof, and $0 \leq M \leq 0.5$, $0 \leq D \leq 0.5$, $0 < T1 \leq 0.95$, $0 < T2 \leq 0.2$, $0 < Q \leq 0.95$, provided that $M+D+T1+T2+Q=1$.

(3) In Chemical Formula 1, $M=0$, $0 \leq D \leq 0.2$, $0 < T1 < 0.5$, $0 < T2 < 0.2$, $0.5 \leq Q \leq 0.95$, and $D+T1+T2+Q=1$.

(4) In Chemical Formula 1, $M=0$, $D=0$, $0 < T1 < 0.4$, $0 < T2 < 0.2$, $0.6 \leq Q \leq 0.9$, and $T1+T2+Q=1$.

(5) A weight average molecular weight (Mw) of the silicon-containing polymer is 1,000 to 100,000 g/mol in terms of a polystyrene standard sample.

(6) An amount of the silicon-containing polymer is 1 weight % to 30 weight % based on a total weight of the curable resin composition.

(7) The curable resin composition further comprises an organic polymer having a boiling point of from 100° C. to 250° C.

(8) The organic polymer may comprise a polyalkylene oxide copolymer, a polyarylene oxide copolymer, a glycol copolymer, or a combination thereof.

(9) The organic polymer may have a number average molecular weight (Mn) of 100 g/mol to 10,000 g/mol.

(10) An amount of the organic polymer may be 0.1 weight % to 10 weight % based on a total weight of the curable resin composition.

(11) An average diameter ($D_{50}$) of the hollow silica particles is 10 nanometers (nm) to 300 nm.

(12) An average porosity of the hollow silica particles is 40% to 90%.

(13) An amount of the hollow silica particles is 0.1 weight % to 15 weight % based on a total weight of the curable resin composition.

(14) The curable resin composition further comprises a surface modifying additive comprising a fluorine-based surfactant.

(15) Another embodiment provides a thin film prepared by curing the curable resin composition.

(16) The thin film has a refractive index of less than or equal to 1.35 with respect to light having a wavelength of 500 nm to 550 nm and a water contact angle of greater than or equal to 105°.
(17) Further, another embodiment provides a color conversion panel including the thin film.
(18) Still another embodiment provides a display device including the color conversion panel.

The curable resin composition according to embodiments of the present disclosure may be cured at a low temperature, and the thin film prepared from the composition may have a low refractive index, a high contact angle to water, and high adhesion. Accordingly, the thin film prepared from the composition according to the embodiment may advantageously be used in various suitable display devices.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
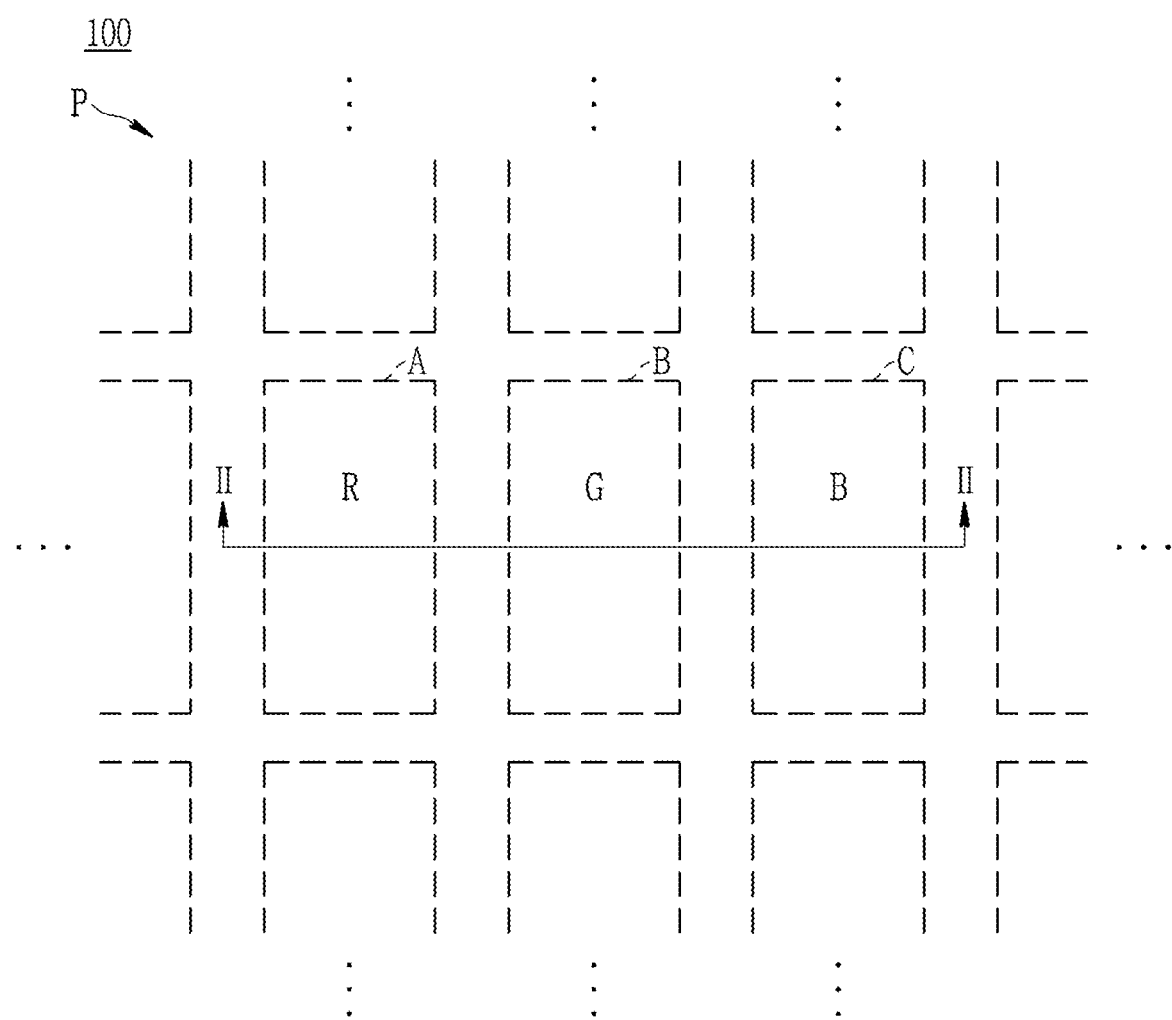
FIG. 1 is a schematic top plan view of a color conversion panel according to an embodiment.

Hereinafter, example embodiments of the present disclosure will be described in more detail, referring to the accompanying drawings. However, in the description of the present disclosure, descriptions for already known functions or components will be omitted to clarify the present disclosure.

In order to clearly describe the present disclosure, parts which are not related to the description are omitted, and the same reference numeral refers to the same or like components, throughout the specification. In addition, because the size and the thickness of each component shown in the drawing may optionally be represented for convenience of the description, the present disclosure is not limited to the illustration.

In the drawings, the thickness of layers, films, panels, regions, etc., may be exaggerated for clarity. In the drawings, the thickness of a part of layers or regions, etc., may be exaggerated for clarity. It will be understood that when an element such as a layer, film, region, or substrate is referred to as being "on" another element, it can be directly on the other element or intervening elements may also be present.

An embodiment provides a curable resin composition having a low refractive index, a high water contact angle, and good adhesion to a substrate and/or an adjacent layer.

As a display has been recently developed, various display devices using displays are being diversified (e.g., being used in a variety of diverse display devices). There are needs for luminous efficiency of photoluminescence materials in OLED or display devices including quantum dots of the display devices. Low refractive index materials may be used for various suitable devices dealing with light. When using characteristics of a low refractive index, a low reflectance effect may be exhibited. The low refractive index materials may be used for a layer that decreases light loss on a low reflection layer of a lens outside of a photosensor, on an anti-reflection coating (AR) of an outermost of a display and/or a solar cell, and/or inside the device where light moves, to increase efficiency. In addition, as the refractive index of the coating layer is lowered, a thickness of the coating layer may be decreased, and thus a margin of the coating film may become wider and efficiency according to device purposes may be increased.

By existing technologies, a baking process is carried out at a temperature of 350° C. or higher and at least 300° C. or higher when using a thermosetting low refractive index material. In some embodiments, it is possible to use vapor deposition, such as a CVD (Chemical Vapor Deposition) method, which utilizes expensive devices, but it is difficult to obtain a thick layer or to make nanopores in the layer, and thus, it is difficult to obtain low-refractive properties as described above utilizing a CVD method. When a fluorine-based compound or epoxy polymers are used, it is not easy to realize a low refractive index property, and even though realized, cracks may occur as the thickness is reduced to a micrometer level. While silicon-based materials easily realize a low refractive index, adhesion to an upper and/or lower layer decreases as the thickness of a layer increases. For example, when a pattern layer, such as, for example, a color filter layer, is present under a layer having a low refractive index, the substrate may not be flat and may have steps due to the patterns. In this case, when the step is large and a coating realizing a low refractive index fills the gap between the steps, a thickness of the coating may become very thick and cracks may occur in this region. Accordingly, it is difficult to form a thick layer having a low refractive index, wherein no crack occurs, and having good adhesion to an upper and/or lower layer.

According to an embodiment, the curable resin composition may be curable at a relatively low temperature, such as, for example, less than or equal to about 300° C., less than or equal to about 200° C., less than or equal to about 270° C., less than or equal to about 250° C., or less than or equal to about 240° C., and the layer prepared from the composition may have a low refractive index and good adhesion.

The curable resin composition according to an embodiment comprises a silicon-containing polymer, hollow silica particles having greater than or equal to two times higher maximum peak value in Q4 region than that in Q3 region, as measured by silicon nuclear magnetic resonance spectroscopy (Si-NMR) analysis, and a solvent.

The silicon-containing polymer may include a carbosilane-siloxane copolymer.

Hereinafter, each component of the curable resin composition is explained in more detail.

a) Silicon-Containing Polymer

Silicon-containing polymers have a low refractive index material. The curable resin composition according to an embodiment may include a silicon-containing polymer such as, for example, a carbosilane-siloxane copolymer represented by Chemical Formula 1, as a polymer matrix:

$$(R^4R^5R^6SiO_{1/2})_M(R^7R^8SiO_{2/2})_D(R^9SiO_{3/2})_{T1}$$
$$(SiO_{3/2}-Y-SiO_{3/2})_{T2}(SiO_{4/2})_Q \quad \text{Chemical Formula 1}$$

In Chemical Formula 1, $R^4$ to $R^9$ may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 heteroalkyl group, a substituted or unsubstituted C6 to C30 aryl group, a substituted or unsubstituted C3 to C30 cycloalkyl group, a substituted or unsubstituted C2 to C30 heterocycloalkyl group, a substituted or unsubstituted C1 to C30 alkoxyl group, carboxyl group, R(C=O), R(=O)O— (wherein, R is hydrogen, a C1 to C30 alkyl group, a C3 to C30 cycloalkyl group, a C6 to C30 aryl group, or a combination thereof), an epoxy-containing monovalent organic group, a (meth)acrylic group, a (meth)acrylate group, or a combination thereof, Y may be a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a combination thereof, and $0 \le M \le 0.5$, $0 \le D \le 0.5$, $0 < T1 \le 0.95$, $0 < T2 \le 0.2$, $0 < Q \le 0.95$, provided that $M+D+T1+T2+Q=1$.

In an example embodiment, in Chemical Formula 1, $M=0$, $0 \le D \le 0.2$, $0 < T1 < 0.5$, $0 < T2 < 0.2$, $0.5 \le Q \le 0.95$, and $D+T1+T2+Q=1$, and for example, $M=0$, $D=0$, $0 < T1 < 0.4$, $0 < T2 < 0.2$, $0.6 \le Q \le 0.9$, and $T1+T2+Q=1$.

When the curable resin composition includes a carbosilane-siloxane copolymer as described above as a polymer matrix, the resin may have a low refractive index and it is possible to prevent or reduce occurrence of cracks in the curable resin composition at a high temperature.

In Chemical Formula 1, $R^4$ to $R^9$ may independently be a C1 to C10 alkyl group, a C3 to C20 cycloalkyl group, a C2 to C20 heterocycloalkyl group, an epoxy-containing monovalent organic group, a C6 to C30 aryl group, a (meth)acrylic group, a (meth)acrylate group, an alkyl group substituted with a (meth)acrylic group, an alkyl group substituted with a (meth)acrylate group, or a combination thereof, and are not limited thereto.

In Chemical Formula 1, Y may be a C1 to C10 alkylene group, a C4 to C10 cycloalkylene group, a C6 to C20 arylene group, or a combination thereof, and is not limited thereto.

As shown from Chemical Formula 1, the carbosilane-siloxane copolymer includes a carbohydrate group Y, which links between two silicon (Si) atoms, in an amount of less than 0.2 moles based on a total mole number of total structural units of the copolymer, in addition to main linkages between silicon (Si) atom and oxygen (O) atom, and thus, the carbosilane-siloxane copolymer may have flexibility in its structure, while having a high surface hardness that does not or substantially does not crack at a high temperature. Additionally, the carbosilane-siloxane copolymer may form a polymer matrix having a high transmittance and a low refractive index.

A weight average molecular weight (Mw) of the carbosilane-siloxane copolymer may be 1,000 to 100,000 g/mol in terms of a polystyrene standard sample. For example, the weight average molecular weight (Mw) of the silicon-containing polymer may be 1,000 to 90,000 g/mol, for example, 1,000 g/mol to 80,000 g/mol, for example, 1,000 g/mol to 70,000 g/mol, for example, 1,000 g/mol to 60,000 g/mol, for example, 1,000 g/mol to 50,000 g/mol, for example, 1,000 g/mol to 40,000 g/mol, for example, 1,000 g/mol to 30,000 g/mol, for example, 1,000 g/mol to 20,000 g/mol, for example, 1,000 g/mol to 10,000 g/mol, for example, 1,000 g/mol to 9,000 g/mol, for example, 1,000 g/mol to 8,000 g/mol, for example, 1,000 g/mol to 7,000 g/mol, for example, 1,500 g/mol to 7,000 g/mol, for example, 2,000 g/mol to 7,000 g/mol, for example, 2,000 g/mol to 6,500 g/mol, for example, 2,000 g/mol to 6,000 g/mol, for example, 2,000 g/mol to 5,500 g/mol, for example, 2,000 g/mol to 5,000 g/mol, for example, 2,000 g/mol to 4,500 g/mol, for example, 2,000 g/mol to 4,000 g/mol, for example, 2,500 g/mol to 4,000 g/mol, or, for example, 3,000 g/mol to 4,000 g/mol, and is not limited thereto.

When the molecular weight of the carbosilane-siloxane copolymer is in the above range, the layer prepared from the copolymer may have a low refractive index, while not (or substantially not) having cracks.

In an example embodiment, the carbosilane-siloxane copolymer may be formed by a hydrolysis-condensation reaction of a silane compound represented by Chemical Formula 2 and a carbosilane compound represented by Chemical Formula 3:

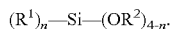   Chemical Formula 2

In Chemical Formula 2, $R^1$ may be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 heteroalkyl group, a substituted or unsubstituted C6 to C30 aryl group, a substituted or unsubstituted C3 to C30 cycloalkyl group, a substituted or unsubstituted C2 to C30 heterocycloalkyl group, a substituted or unsubstituted C1 to C30 alkoxy group, carboxyl group, R(C=O)—, R(C=O)O— (wherein, R is hydrogen, a C1 to C30 alkyl group, a C3 to C30 cycloalkyl group, or a C6 to C30 aryl group), an epoxy-containing monovalent group, a (meth)acrylic group, a (meth)acrylate group, or a combination thereof, $R^2$ may be hydrogen, or a C1 to C30 alkyl group, a C3 to C30 cycloalkyl group, a C2 to C30 alkenyl group, or a C6 to C30 aryl group, and $0 \le n < 4$;

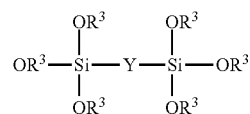   Chemical Formula 3 wherein, in Chemical Formula 3, $R^3$ may independently hydrogen, a C1 to C30 alkyl group, a C3 to C30 cycloalkyl group, a C2 to C30 alkenyl group, or a C6 to C30 aryl group, and Y may be a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a combination thereof.

In Chemical Formula 1, $0 \le n < 3$.

The hydrolysis-condensation reaction of a silane compound represented by Chemical Formula 2 and a carbosilane compound represented by Chemical Formula 3 may be performed in a solvent that contains water in the presence of an acidic or alkaline catalyst.

In Chemical Formulae 1 to 3, the term "substituted" means that each group is substituted with an alkyl group, alkenyl group, aryl group, hydroxyl group, carboxyl group, epoxy group, (meth)acrylic group, (meth)acrylate group, cyano group, amino group, nitro group, halogen atom, or a combination thereof.

In Chemical Formula 2, $R^1$ may be a C1 to C10 alkyl group, a C3 to C20 cycloalkyl group, an epoxy-containing monovalent group, a C6 to C20 aryl group, a (meth)acrylic group, a (meth)acrylate group, an alkyl group substituted with a (meth)acrylic group, an alkyl group substituted with a (meth)acrylate group, or a combination thereof, and are not limited thereto.

Examples of the silane compound represented by Chemical Formula 2 are tetramethyl orthosilicate (TMSO), tetraethyl orthosilicate (TEOS), tetraisopropoxysilane, methyltrimethoxysilane, dimethyldimethoxysilane, phenyltrimethoxysilane, diphenyldimethoxysilane, methyltriethoxysilane, dimethyldiethoxysilane, phenyltriethoxysilane, diphenyldiethoxysilane, isobutyltrimethoxysilane, vinyltrimethoxysilane, vinyltriethoxysilane, vinyl-tris(β-methoxyethoxy)silane, 3,3,3-trifluoropropyltrimethoxysilane, methyl-3,3,3-trifluoropropyl dimethoxysilane, β-(3,4-epoxycyclohexyl)ethyltrimethoxysilane, γ-glycidoxytripropyltrimethoxysilane, γ-glycidoxypropylmethyldiethoxysilane, γ-glycydoxypropyltriethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, N-β (aminoethyl)-γ-aminiopropylmethyldimethoxysilane, N-β (aminoethyl)-γ-aminiopropyltrimethoxysilane, N-β (aminoethyl)-γ-aminiopropyltriethoxysilane, γ-aminiopropyltrimethoxylsilane, γ-aminiopropyltriethoxylsilane, N-phenyl-γ-aminiopropyltrimethoxylsilane, γ-mercaptopropyltrimethoxysilane, acryloxypropyltrimethoxysilane, and the like, and are not limited thereto.

Examples of the carbosilane compound represented by Chemical Formula 3 are 1,2-bis-(trimethoxysilyl)ethane, 1,2-bis-(triethoxysilyl)ethane, 1,4-bis-(trimethoxysilyl)cyclohexane, and the like, and are not limited thereto.

The carbosilane-siloxane copolymer represented by Chemical Formula 1 may be included in an amount of 1 to 30 wt %, for example, 1 to 20 wt %, for example, 2 to 20 wt %, for example, 2 to 15 wt %, for example, 3 to 15 wt %, or for example, 3 to 10 wt %, based on a total weight of the curable resin composition, and are not limited thereto.

When the carbosilane-siloxane copolymer is included in an amount of the above range in the curable resin composition of an embodiment, the layer prepared from the composition may have a low refractive index and hardly has cracks (e.g., has no or substantially no cracks).

b) Hollow Silica Particles

The curable resin composition according to an embodiment further includes hollow silica particles, which has greater than or equal to two times higher maximum peak value in Q4 region than that in Q3 region, as measured by Si-NMR analysis, in order to further decrease a refractive index of a layer prepared therefrom. Further, by including the hollow silica particles, the layer may have improved adhesion to a substrate and/or an upper and/or lower layer adjacent thereto.

Silicon-based resins have a low refractive material, and when the silicon-based resin includes hollow particles, a refractive index of the resin may further decrease due to the hollow portion inside the particles. Further, the silicon-based resin hardly includes cracks (e.g., includes no or substantially no cracks) even when prepared to a layer having a thickness of several nanometers to several tens of nanometers. However, as the layer becomes thick, delamination may occur as adhesion among the layer and the upper and/or lower layer thereof weakens due to a change in a curing mechanism of the composition that forms the layer. This may be an issue in an electronic device including the layer, such as, for example, a color conversion panel forming process. Accordingly, it is desirable that the layer may be formed as thick as possible to suitably or sufficiently cover upper and/or lower patterns, while having no (or substantially no) cracks, as well as improved adhesion, such that the layer may not be delaminated from the upper and/or lower layer.

While the present disclosure is not limited by any particular mechanism or theory, the inventors have found that as the amount of silanol groups (Si—OH) present on a surface of the hollow silica particles, which are added to decrease a refractive index of a curable resin composition, is smaller, adhesion of a curable resin composition including the hollow silica particles may be stronger. When the maximum value of the peak in the Q4 region, which indicates $SiO_{4/2}$ at a surface of the hollow silica particle, as measured by Si-NMR analysis, is greater than two times of that in the Q3 region that indicates $SiO_{3/2}$—OH at a surface of the hollow silica particle, the layer prepared from a composition including the hollow particles may have a water contact angle of greater than or equal to 105°, and becomes hydrophobic, while having high adhesion of the layer of greater than or equal to 4B, as measured by the cross-cut taping test, which was very surprising and would not have been expected from a person skilled in the art. Generally, as the layer is hydrophilic, the layer may have better adhesion to inorganic layers present in the upper and/or lower layer. In this regard, the effect of the subject matter of the present disclosure is very surprising and cannot be expected from a person skilled in the art from prior art.

The cross-cut taping test is performed according to ASTM D3359 international standard test method. For the test, a laminated film is cross-cut on a surface thereof in square having a size of 15 mm in wide, 15 mm in length, and 50 to 125 μm in depth from a top of the surface thereof. Then, a testing tape having an adhesion force of about 4.5 Newton/meter (N/m) is attached to the cross-cut region, and detached therefrom to test an adhesion force of the laminated film. The adhesion force evaluation index is expressed by the fraction of area detached by the testing tape according to ASTM D3359 international measuring standard. For example, when the index is 0B, a whole area of the laminated film is detached by the testing tape, while when the index is 5B, delamination of the laminated film never occurs (e.g., does not occur).

The layer according to an embodiment exhibited 4B of the adhesion force according to the above, which indicates only 20% of the tested area is detached, while 80% is not delaminated and is instead maintained. Contrary to the laminated film of an embodiment, the films according to Comparative Examples of the application, as described herein below, are prepared from a curable resin composition including hollow silica particles, which has a maximum value of the peak in the Q4 region that is less than two times that of the Q3 region, and exhibited an adhesion force of 3B at most, which eventually decreases to 0B as the amount of the hollow silica particles increases in the composition. Accordingly, it is noted that the curable resin composition according to an embodiment includes a silicon-containing polymer, and hollow silica particles having greater than or equal to two times higher a maximum value of the peak in the Q4 region than that in the Q3 region, as measured by Si-NMR analysis, and thus, a layer cured therefrom may have an improved thermal stability and good adhesion.

In an example embodiment, the hollow silica particles may be aluminosilicate hollow silica nanoparticles, which are prepared by a hydrolysis-condensation reaction of a silane compound and aluminum precursor. For example, the aluminosilicate hollow nanoparticles may be prepared by the method described in KR Patent No.: 10-165970961, the entire content of which is hereby incorporated by reference.

According to KR Patent No.: 10-165970961, core-shell particles having an aluminosilicate shell, which is prepared by reacting a silane compound and aluminum precursor in a set or specific mole ratio on a template core, which is prepared from a micelle or a reverse-micelle of an organic polymer, are prepared first. Then, the core-shell particles are reacted with an alkaline aqueous solution or an acidic aqueous solution to form nanopores on the shell, while concurrently (e.g., simultaneously) dissolving and removing the core to provide hollow aluminosilicate particles, and then, the hollow aluminosilicate particles are subjected to water heat treatment to prepare hollow aluminosilicate nanoparticles of which the density increases. The obtained hollow aluminosilicate nanoparticles may have low refractive properties, and prevent or reduce aggregation by not being subjected to a high temperature annealing process during the core-removing process. Further, the hollow aluminosilicate nanoparticles may have improved physical properties, such as, for example, anti-scratchability, as well as a low refractive index, and enhanced optical properties, such as, for example, a low haze, by reacting the core-shell particles with an alkaline or acidic solutions to form nanopores, and then subjecting them to water heat treatment to increase a density thereof.

An average diameter ($D_{50}$) of the hollow silica particles may be 10 nm to 300 nm, for example, 10 nm to 250 nm, 10 nm to 200 nm, 10 nm to 180 nm, 20 nm to 150 nm, 20 nm to 130 nm, 30 nm to 130 nm, 40 nm to 130 nm, 50 nm to 130 nm, 50 nm to 120 nm, 50 nm to 110 nm, or 60 nm to 100 nm, but is not limited thereto. When the average diameter size of the hollow silica particles satisfies the above ranges, the hollow silica particles may be well dispersed in a polymer matrix, may effectively reduce a refractive index of the low refractive layer, may increase thermal stability, and may realize good adhesion.

A porosity of the hollow silica particles may be 40% to 90%, for example, 40% to 80%, 40% to 70%, 40% to 60%, 40% to 50%, 50% to 90%, 60% to 90%, 70% to 90%, 80% to 90%, or 50% to 70%, but is not limited thereto. When the porosity of the hollow silica particles exceeds the above range, sizes of the inner spaces of the hollow silica particles becomes large and a thickness of the outer periphery thereof becomes small, and thus, durability of the hollow particles may be decreased, while when the porosity of the hollow particles is less than the above range, an effect of reducing a refractive index of the low refractive layer and/or improvement in adhesion may be negligible or reduced.

The hollow silica particles may be included in an amount of, for example, 0.1 to 15 wt %, 1 to 15 wt %, 1 wt % to 10 wt %, or 2 to 8 wt %, based on a total weight of the cured resin composition of the embodiment, but is not limited thereto.

By including the hollow silica particles having the maximum value of the peak in the Q4 region of greater than or equal to two times that of the Q3 region, the curable resin composition of an embodiment may have a low refractive index, a high contact angle to water, and good adhesion to a substrate and/or an upper and/or lower layer thereof.

c) Organic Polymer Having a Boiling Point of 100° C. to 250° C.

The curable resin composition according to an embodiment further includes an organic polymer having a boiling point of from 100° C. to 250° C.

By including an organic polymer having a boiling point of from 100° C. to 250° C., the organic polymer may evaporate from the composition when the temperature of the composition increases to 100° C. or more by curing. In this case, nanopores may be formed where the organic polymer was present, and thus, the layer having the nanopores may have a lower refractive index than those do not include the nanopores.

Examples of the organic polymer having a boiling point of from 100° C. to 250° C. may include a polyalkylene oxide copolymer, a polyarylene oxide copolymer, a glycol copolymer, or a combination thereof.

Examples of the glycol copolymer may include poly(ethylene) glycol), poly(propylene) glycol, and the like, and the examples of the polyalkylene oxide copolymer or polyarylene oxide copolymer may include polyethylene oxide, polypropylene oxide, poly(phenylene) oxide, and the like, and are not limited thereto.

The organic polymer may have a number average molecular weight (Mn) of 100 g/mol to 10,000 g/mol, for example, 100 g/mol to 8,000 g/mol, for example, 200 g/mol to 7,000 g/mol, for example, 300 g/mol to 6,000 g/mol, for example, 400 g/mol to 5,500 g/mol, for example, 400 g/mol to 5,000 g/mol, for example, 500 g/mol to 5,000 g/mol, for example, 500 g/mol to 4,500 g/mol, for example, 600 g/mol to 5.000 g/mol, for example, 600 g/mol to 4,500 g/mol, for example, 700 g/mol to 5,000 g/mol, for example, 700 g/mol to 4,500 g/mol, for example, 800 g/mol to 5,000 g/mol, for example, 800 g/mol to 4,500, g/mol, for example, 900 g/mol to 5,000 g/mol, for example, 900 g/mol to 4,500, g/mol, for example, 1,000 g/mol to 5,000 g/mol, for example, 1,000 g/mol to 4,500 g/mol, for example, 1,000 g/mol to 4,000 g/mol, for example, 1,000 g/mol to 3,500 g/mol, for example, 1,000 g/mol to 3,000 g/mol, for example, 1,000 g/mol to 2,500 g/mol, or, for example, 1,000 g/mol to 2,000 g/mol, and is not limited thereto.

An amount of the organic polymer may be 0.1 weight % to 10 weight %, for example, 0.5 weight % to 10 weight %, for example, 1 weight % to 10 weight %, for example, 2 weight % to 8 weight %, or for example, 3 weight % to 7 weight %, based on a total weight of the curable resin composition, and is not limited thereto.

d) Solvent

The cured resin composition according to an embodiment may include any suitable solvent usable at a process temperature of greater than or equal to 200° C., which may be one type (or kind) of solvent or a mixture of more than two types (or kinds) of solvents. For example, the solvent may include an aprotic solvent and/or a protic solvent.

For example, the aprotic solvent may include an ether-based solvent, such as, for example, diethyl ether, methyl-ethyl ether, methyl-n-di-n-propyl ether, di-iso-propyl ether, tetrahydrofuran, methyl tetrahydrofuran, dioxane, dimethyldioxane, ethylene glycol dimethyl ether, ethylene glycol diethyl ether, ethylene glycol di-n-propyl ether, ethylene glycol di-butyl ether, diethylene glycol dimethyl ether, diethylene glycol diethyl ether, diethylene glycol methylethyl ether, diethylene glycol methyl mono-n-propyl ether, diethylene glycol methyl mono-n-butyl ether, diethylene glycol di-n-propyl ether, diethylene glycol di-n-butyl ether, diethylene glycol methyl mono-n-hexyl ether, triethylene glycol dimethylether, triethylene glycol diethyl ether, triethylene glycol methylethyl ether, triethylene glycol methyl mono-n-butyl ether, triethylene glycol di-n butyl ether, triethylene glycol methyl mono-n-hexyl ether, tetraethylene glycol dimethylether, tetraethylene glycol diethyl ether, tetra diethylene glycol methylethyl ether, tetraethylene glycol methyl mono-n-butyl ether, diethylene glycol di-n-butyl ether, tetraethylene glycol methyl mono-n-hexyl ether, tetraethylene glycol di-n-butyl ether, propylene glycol diethyl ether, propylene glycol diethyl ether, propylene glycol di-n-propyl ether, propylene glycol dibutyl ether, dipropylene glycol dimethyl ether, dipropylene glycol diethyl ether, dipropylene glycol methylethyl ether, dipropylene glycol methyl mono-n-butyl ether, dipropylene glycol di-n-propyl ether, dipropylene glycol di-n-butyl ether, dipropylene glycol methyl mono-n-hexyl ether, tripropylene glycol dimethyl ether, tripropylene glycol diethyl ether, tripropylene glycol methylethyl ether, tripropylene glycol methyl mono-n-butyl ether, tripropylene glycol di-n-butyl ether, tripropylene glycol methyl mono-n-hexyl ether, tetrapylene glycol dimethyl ether, tetrapropylene glycol diethyl ether, tetradipropylene glycol methyl ethyl ether, tetrapropylene glycol methyl mono-n-butyl ether, dipropylene glycol di-n-butyl ether, tetrapropylene glycol methyl mono-n-hexyl ether, tetrapropylene glycol di-n-butyl ether, and/or the like; an ester-based solvent, such as, for example, methyl acetate, ethyl acetate, n-propyl acetate, i-propyl acetate, n-butyl acetate, i-butyl acetate, sec-butyl acetate, n-pentyl acetate, sec-pentyl acetate, 3-methoxibutyl acetate, methylpentyl acetate, 2-ethyl butyl acetate, 2-ethyl hexyl acetate, benzyl acetate, cyclohexyl acetate, acetic diethyleneglycol mono-n-butyl ether, acetic dipropyleneglycol mono-methyl ether, acetic dipropyleneglycol mono-ethyl ether, diacetic glycol, acetic methoxy triglycol, propionic ethyl, propionic n-butyl, propionic i-amyl, oxalic diethyl, oxalic-di-n-butyl, and/or the like; an ether acetate based solvent, such as, for example, ethylene glycol methyl ether propionate, ethylene glycol ethyl ether propionate, ethylene glycol methyl ether acetate, ethylene glycol ethyl ether acetate, diethylene glycol methyl ether acetate, diethylene glycol ethyl ether acetate, diethylene glycol-n-butyl ether acetate, propylene glycol methyl ether acetate, propylene glycol ethyl ether acetate, propylene glycol propyl ether acetate, dipropylene glycol methyl ether acetate, dipropylene glycol ethyl ether acetate, and/or the like, but are not limited to them.

Examples of protonic solvent may include alcohol-based solvents, such as, for example, methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethyl butanol, sec-heptanol, n-octanol, 2-ethylhexanol, sec-octanol, n-nonyl alcohol, n-decanol, sec-undecyl alcohol, trimethyl nonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol, tripropylene glycol, and the like; ether-based solvents, such as, for example, ethylene glycol methyl ether, ethylene glycol ethyl ether, ethylene glycol monophenyl ether, diethylene glycol mono methyl ether, diethylene glycol mono ethyl ether, diethylene glycol mono-n-butyl ether, diethylene glycol mono-n-hexyl ether, ethoxy triglycol, tetraethylene glycol-n-butyl ether, propylene glycol monomethyl ether, propylene glycol propyl ether, dipropylene glycol monomethyl ether, dipropylene glycol monoethyl ether, tripropylene glycol monomethyl ether, and the like; ester-based solvents, such as, for example, methyl lactic acid, ethyl lactic acid, n-butyl lactic acid, n-amyl lactic acid, and the like, and are not limited thereto. Among these, alcohol-based solvents may be used in terms of storage stability.

The solvent may be included in an amount of 30 wt % to 95 wt %, for example, 40 wt % to 90 wt %, for example, 45 wt % to 90 wt %, for example, 50 wt % to 90 wt % t, based on a total weight of the curable resin composition, and may be suitably or appropriately adjusted according to the total solid content.

e) Other Additives

The curable resin composition of an embodiment may further include various suitable additives used in the art to which the present disclosure pertains. The additives may include a surfactant to improve coating properties and prevent or reduce defects of the composition, for example, a fluorine-based surfactant, and is not limited thereto. These additives may be included in an amount of 10 parts by weight or less, for example, 5 parts by weight or less, for example, 5 parts by weight or less, for example, 3 parts by weight or less, for example, 2 parts by weight or less, for example, 1 part by weight or less, based on 100 parts by weight of the silicon-containing polymer, for example, the carbosilane-siloxane copolymer represented by Chemical Formula 1.

Another embodiment provides a thin film prepared by curing the curable resin composition.

The thin film may have a refractive index with respect to a wavelength of 500 nm to 550 nm, for example, 1.30 or less, for example, 1.25, for example, 1.20 or less, 1.18 or less, for example, 1.15 or less, and an average light transmittance of 90% or more, 92% or more, for example, 95% or more.

In order to manufacture a thin film having a low refractive index as described above, curing at a high temperature of 350° C. or more and at least 300° C. or expensive equipment such as chemical vapor deposition (CVD) should be used. In addition, there is a method of using hollow silica, but in this case, it was difficult to reduce the refractive index to 1.2.

However, the curable resin composition according to an embodiment may be cured at a low curing temperature, for example, in a range of about 180° C. to about 240° C. within about 10 minutes to about 1 hour, thereby easily preparing a crack-free thin film having a thickness of about 1 to about 10 μm, for example, about 2 to about 7 μm, for example, about 2 to about 5 μm, while having the above range of refractive index.

Furthermore, the thin film has good adhesion to an upper and/or lower layer.

Although the thin film has a water contact angle of greater than or equal to 105°, and is rather hydrophobic, it may have good adhesion to a substrate and/or to an upper and/or lower layer. For example, when a thin film such as SiOx is stacked on the thin film, the adhesive force is very high about 4B or more, for example, about 5B, when the upper thin film is tested after cross-cutting.

On the contrary, a thin film prepared from a composition that is similar to that of an embodiment but includes hollow silica particles having the maximum value of the peak in the Q3 region is greater than or equal to that in the Q4 region exhibits a reduced water contact angle of 102° or less, and the adhesion force measured by the test taping attached to upper and/or lower layers of the film after cross-cutting was rapidly reduced to 3B or less.

Accordingly, the thin film according to an embodiment may be used in various suitable fields such as a material for various suitable electronic materials, for example, a low refractive layer of a color conversion panel, an outermost anti-reflection film of a display or solar cell, a low reflective layer of a lens outside a light sensor, and a coating material for an optical member.

In this regard, another embodiment provides a color conversion panel including the thin film.

The color conversion panel may include a substrate; a low refractive layer on a surface of the substrate; a color conversion layer on the low refractive layer or between the low refractive layer and the substrate; and a planarization layer covering the low refractive layer and the color conversion layer, wherein the low refractive layer is prepared from the curable resin composition of an embodiment.

Herein, as the curable resin composition of an embodiment is the same as described above, duplicative descriptions regarding the curable resin composition are not repeated here.

In an example embodiment, the low refractive layer may be prepared by coating the curable resin composition of an embodiment on a substrate, and/or on the color conversion layer, drying, and then curing the same. For example, the curable resin composition of an embodiment is coated on a substrate, and/or on a color conversion layer on the substrate, and is dried and cured at a temperature of greater than or equal to 150° C. and less than or equal to 250° C., for example, greater than or equal to 170° C. and less than or equal to 250° C., greater than or equal to 180° C. and less than or equal to 250° C., greater than or equal to 180° C. and less than or equal to 240° C., greater than or equal to 190° C. and less than or equal to 240° C., greater than or equal to 200° C. and less than or equal to 240° C., greater than or equal to 210° C. and less than or equal to 240° C., or greater than or equal to 220° C. and less than or equal to 240° C., for about 10 minutes to about 1 hour.

The composition may be coated on the substrate and/or on the color conversion layer by various suitable methods available in the art to which the present disclosure pertains. In some embodiments, the composition may be coated on the substrate and/or on the color conversion layer by a spin coating, a slit and spin coating, a slit coating, a roll coating method, and/or a die coating, but is not limited thereto. In an example embodiment, the composition may be spin-coated on a substrate and/or on a color conversion layer.

The low refractive layer may have a thickness of 100 nm to 10 μm. For example, the low refractive layer may have a thickness of about 1 to 10 μm, for example, about 1 to 8 μm, for example, about 1 to 7 μm, or for example, about 1 to 5 μm.

Hereinafter, the color conversion layer according to an example embodiment is explained in more detail, referring to the drawings.

Figure 2:
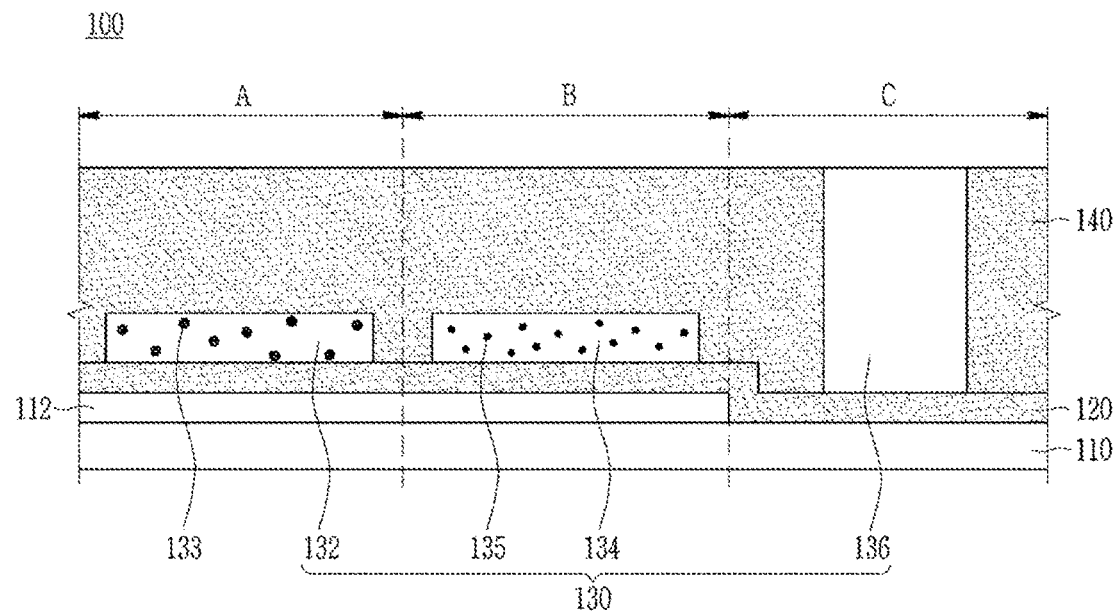
FIG. 2 is a schematic cross-sectional view showing a cross-section taken along the II-II line of FIG. 1.
Figure 3:
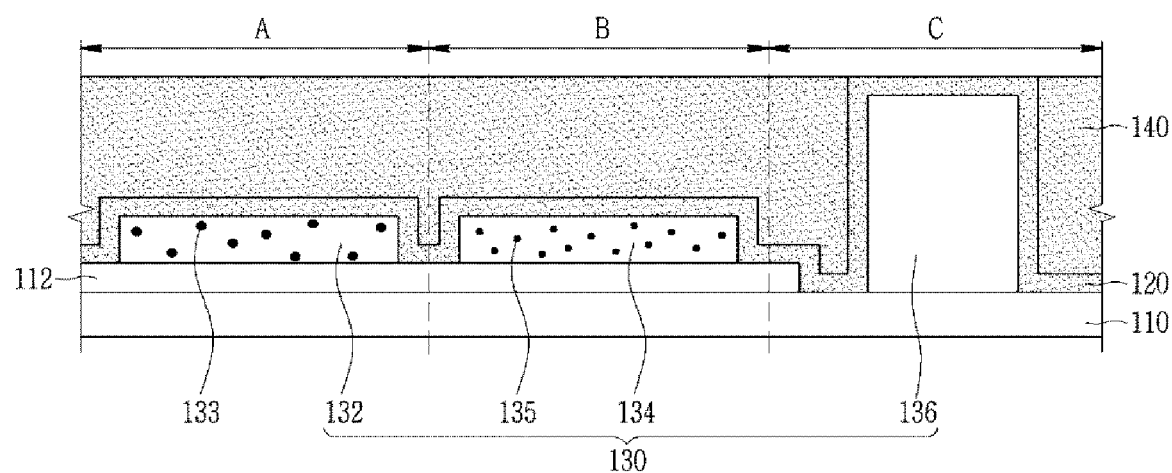
FIG. 3 is a cross-sectional view according to an example variation of FIG. 2.

FIG. 1 is a schematic top plan view of a color conversion panel according to an embodiment, and FIG. 2 and FIG. 3 are schematic cross-sectional views showing a cross-section taken along the II-II line of FIG. 1.

Referring to FIG. 2 and FIG. 3, a color conversion panel 100 according to an example embodiment includes a substrate 110, a low refractive layer 120, a color conversion layer 130, and a planarization layer 140, wherein the color conversion layer 130 may include color conversion layers that emit light having at least two different wavelengths such as a first color conversion layer 132 that emits light having a first wavelength and a second color conversion layer 134 that emits light having a second wavelength. For example, the first color conversion layer 132 of a first region A may emit red (R) light, and the second color conversion layer 134 of a second region B may emit green (G) light, but are not limited thereto. Further, the color conversion panel 100 may further include a third color conversion layer of a third region C that emits blue (B) light or white (W) light.

The substrate 110 is made of a transparent and electrically insulative material and a protective layer 112 may be further included at positions corresponding to the first color conversion layer 132 and the second color conversion layer 134. The protective layer 112 is formed on one surface of the substrate 110 and makes patterning of the color conversion layer be performed smoothly and protects the color conversion member inside the color conversion layer when the color conversion layer 130 is formed on the substrate 110.

The low refractive layer 120 may cover a portion of the substrate 110 and the protective layer 112 on one surface of the substrate 110, for example, one surface of the substrate 110 on which the protective layer 112 is formed, or may be formed on the color conversion layer 130 to cover the color conversion layer 130, a portion of the substrate 110, and the protective layer 112, as shown in FIG. 3. For example, FIG. 2 and FIG. 3 are the same as each other, except for the difference that, in FIG. 2, the low refractive layer 120 is positioned under color conversion layer 130, and is on the color conversion layer 130 in FIG. 3.

The low refractive layer 120 according to an embodiment has a relatively low refractive index of less than or equal to about 1.35, for example, less than or equal to 1.32, for example, less than or equal to 1.31, less than or equal to 1.30, less than or equal to 1.29, less than or equal to 1.28, less than or equal to 1.27, less than or equal to 1.26, less than or equal to 1.25, less than or equal to 1.24, less than or equal to 1.23, less than or equal to 1.22, less than or equal to 1.21, less than or equal to 1.20, less than or equal to 1.19, less than or equal to 1.18, less than or equal to 1.17, less than or equal to 1.16, or less than or equal to 1.15, for light having a wavelength of 500 nm to 550 nm. When the low refractive layer 120 is formed on or under the color conversion layer 130, or both on and under the color conversion layer 130, reflection of light emitted from the color conversion layer 130 toward the substrate 110 may be prevented or reduced. In some embodiments, as light passes through the low refractive layer 120, it is reflected or refracted due to a difference in refractive index and moves to the color conversion layer 130 again, so that the lost light is reused. Accordingly, the luminous efficiency of the color conversion panel 100 according to an embodiment in which the low refractive layer 120 is formed on or under the color conversion layer 130 or both on and under the color conversion layer 130 may be further improved. The refractive index in the present specification refers to an absolute refractive index indicating a ratio of speeds of light in vacuum and a medium.

In addition, the low refractive layer 120 may have light transmittance of greater than or equal to 90%, for example, greater than or equal to 91%, greater than or equal to 92%, greater than or equal to 93%, greater than or equal to 94%, greater than or equal to 95%, greater than or equal to 96%, greater than or equal to 97%, greater than or equal to 98%, or greater than or equal to 99%, for light having a wavelength of 400 nm, but is not limited thereto. When the light transmittance of the low refractive layer 120 for the light having the wavelength of 400 nm satisfies the above ranges, optical properties of the low refractive layer 120 may be further improved.

Further, an average reflectance (SCE value) in a visible light range of an entire wavelength region of 400 nm to 800 nm may be less than or equal to 10%, less than or equal to 7%, less than or equal to 5%, or less than or equal to 3%. Accordingly, the color conversion panel 100 according to an embodiment may have high light transmittance even at a low wavelength region, and may maintain a low reflectance through an entire wavelength region of a visible light to further improve optical properties.

The first color conversion layer 132 and the second color conversion layer 134 include a first color conversion material 133 that emits a first light and a second color conversion material 135 that emits a second light, respectively. The first color conversion material 133 and the second color conversion material 135 may include quantum dots that convert a wavelength of incident light into other wavelengths. The color conversion material 133 and/or 135 may be formed by coating a composition comprising quantum dots for forming a color conversion layer onto the substrate or low refractive layer 120 on the substrate. The composition for forming a color conversion layer may comprise quantum dots, a binder resin, a photopolymerizable monomer, a photo initiator, a solvent, an additive, and/or the like.

In an example embodiment, the color conversion layer 130 may be prepared by coating a composition for forming a color conversion layer that contains the color conversion materials 133 and 135 including quantum dots on the substrate 110 and/or the low refractive layer 120 on the substrate 110, and patterning the same. The patterning process may include, for example, a step forming a coating layer that includes coating the composition for forming a color conversion layer on the substrate 110 or the low refractive layer 120 by using spin or slit coating method, roll coating method, screen printing method, applicator method, and/or the like, and drying the composition; a step radiating the coating layer to form a pattern corresponding to the first color conversion layer 132 and the second color conversion layer 134 by using a mask; a developing step that removes unnecessary portions; a post-treatment step that includes further heating, radiating active rays, etc., to obtain good pattern in terms of high strength, storage stability, etc., and/or the like, but are not limited thereto.

The first color conversion layer 132 and the second color conversion layer 134 may further include photo scatterers, in addition to the color conversion materials 133 and 135 including quantum dots. Photo scatterers may be distributed in the color conversion layer 130 along with quantum dots. Photo scatterers may introduce incident light to quantum dots, and/or introduce emitted light from quantum dots to emit outside the color conversion layer 130. Accordingly, it is possible to reduce efficiency reduction of the color conversion layer 130.

The planarization layer 140 may be formed on the low refractive layer 120 and the color conversion layer 130. The planarization layer 140 covers the low refractive layer 120 and the color conversion layer 130 to protect them and planarization of the surface of the color conversion panel 100. The planarization layer 140 may be made of a transparent and electrically insulating material so that light may be transmitted. Herein, the planarization layer 140 according to the present embodiment may include (or consist of) the same material as or different from the low refractive layer 120. For example, the planarization layer 140 may be made of a low refractive index material including carbosilane-siloxane copolymer, which may also be included in the low refractive layer 120, and thus, luminous efficiency of the color conversion panel 100 may further improves. In addition, when incident light of the low refractive layer 120 enters the planarization layer 140, reflection and/or scattering may be minimized or reduced, whereby optical loss at the interface may be reduced to provide the color conversion panel 100 having improved photo-efficiency.

In some embodiments, color conversion layer 130 may further include a transmitting member 136 corresponding to the third region (C). The transmitting member 136 may directly emit light received from a light source as itself without any color conversion. For this, for example, the transmitting member 136 may be formed at the same (e.g., substantially the same) height as the color conversion layer 130. However, the transmitting member 136 is not limited thereto, and may also include quantum dots in order to emit light of which a wavelength is converted into a set or certain wavelength like the first color conversion layer 132 and the second color conversion layer 134. In addition, the transmitting member 136 may also include the photo scatterers.

Figure 4:
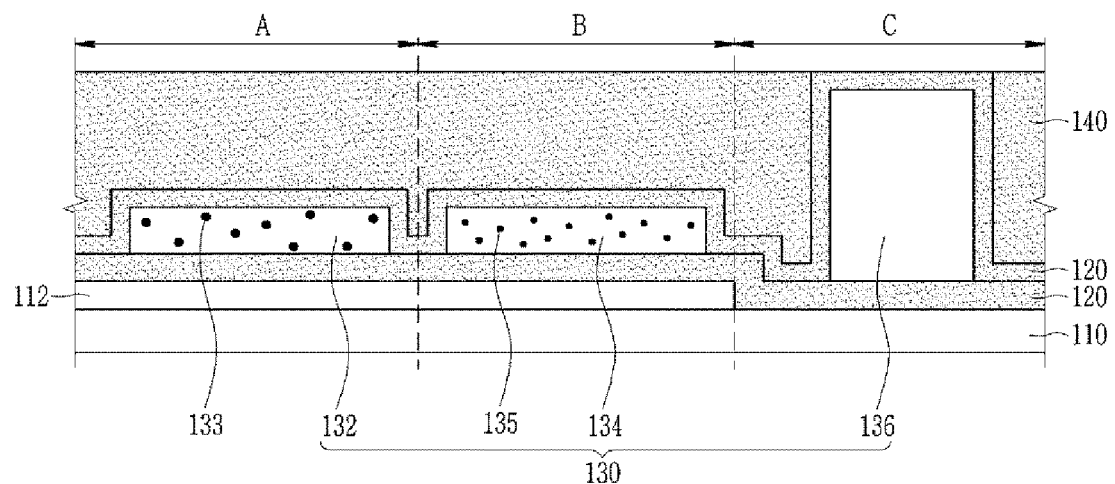
FIG. 4 is a cross-sectional view according to an example variation of FIG. 2 or FIG. 3.

FIG. 4 is a cross-sectional view of an example variation of FIG. 2 and FIG. 3. Referring to FIG. 4, the low refractive layers 120 are formed on and under the color conversion layer 130. The other parts are the same as in FIG. 2 and FIG. 3, except for the low refractive layers 120 that are formed on and under the color conversion layer 130, and thus, duplicative explanation regarding the same parts is not repeated here. As in FIG. 4, when the low refractive layers 120 are formed on and under the color conversion layer 130, luminous efficiency of the color conversion panel 100 may further improve.

Figure 5:
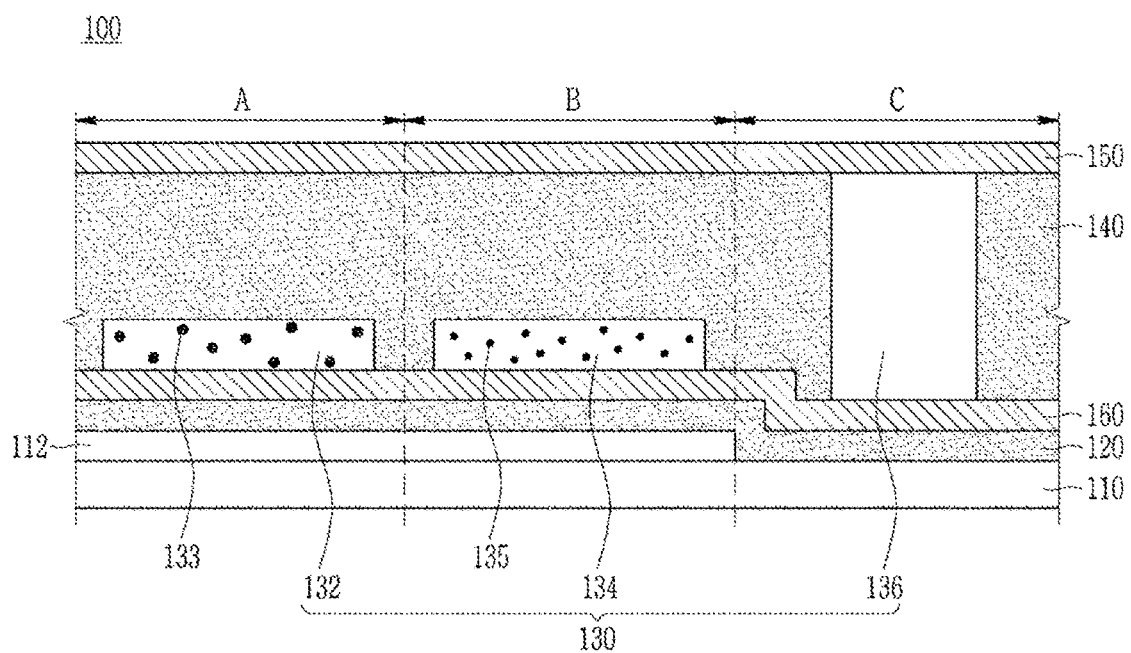
FIG. 5 is a cross-sectional view according to an example variation of FIG. 2.

FIG. 5 is a cross-sectional view of an example variation of FIG. 2. Referring to FIG. 5, the color conversion panel 100 according to an example embodiment may further include a first capping layer 150 and a second capping layer 160. In FIG. 5, although the example embodiment including both the first capping layer 150 and the second capping layer 160 is shown, one of them may be omitted.

The first capping layer 150 may be formed on the planarization layer 140 to cover the planarization layer 140. Therefore, it may be formed after forming the planarization layer 140. The first capping layer 150 may be formed on the entire surface of the substrate 110.

The second capping layer 160 may be formed between the low refractive layer 120 and the color conversion layer 130 and may be formed on the entire surface of the substrate 110, like the first capping layer 150. Therefore, the second capping layer 160 may be formed between the forming process of the low refractive layer 120 and the forming process of the color conversion layer 130.

The first capping layer 150 and the second capping layer 160 may also be made of a material having a low refractive index, such as, for example, $SiN_x$, like in the low refractive layer 120. The first capping layer 150 forming an interface with the planarization layer 140 and the second capping layer 160 between the low refractive layer 120 and the planarization layer 140 and forming interfaces with them may also be made of a material having a low refractive index, and thereby reflection and/or scattering of incident light to the first capping layer 150 and the second capping layer 160 may be minimized or reduced, and thus, optical loss at the interfaces may be minimized or reduced to provide the color conversion panel 100 having improved photo-efficiency. Optical loss at the interfaces may be minimized or reduced by minimizing or reducing the reflection and/or scattering and thus the color conversion panel 100 having improved photo-efficiency may be provided.

The color conversion panel 100 including the first capping layer 150 and the second capping layer 160 may exhibit increased effects of luminous efficiency as much as 150% or more compared with a color conversion panel that does not include the low refractive layer 120, the first capping layer 150, or the second capping layer 160 at all.

As above, the color conversion panel 100 according to an embodiment, and a method of forming the same are described. According to the description, the color conversion panel 100 having improved luminous efficiency of quantum dots is obtained.

Further an embodiment provides a display device including the color conversion panel according to an embodiment.

The display device may include quantum dots, OLED, mini LED, micro LED, nanorod LED, and/or the like, and may be flexible, but is not limited thereto.

Hereinafter, embodiments of the present disclosure are illustrated in more detail with reference to examples. These examples, however, are not in any sense to be interpreted as limiting the scope of the present disclosure.

EXAMPLES

Synthesis Example: Preparation of Carbosilane-Siloxane Copolymer 62.66 g (0.20 mol) of methyltrimethoxy silane (MTMS), 287.50 g (0.6 mol) of tetraethoxyorthosilicate (TEOS), 58.74 g (0.1 mol) of n-phenylaminopropyltrimethoxysilane, 81.56 g (0.1 mol) of 1,2-bistriethoxysilylethane, and 735.60 g of propylene glycol methyl ether acetate (PGMEA) were put in a 2 liter (L) reactor, and a hydrochloric acid aqueous solution prepared by dissolving 1.254 g of 1M hydrochloric acid in 124.34 g of water, while stirred at room temperature, was added thereto over 30 minutes. Subsequently, the reactor was dipped in a 60° C. oil bath and stirred for 180 minutes and then, reacted by using a vacuum pump and a dean-stark apparatus for 240 minutes, and 464.5 g of side products such as methanol, ethanol, a hydrochloric acid aqueous solution, and water in total were discharged therefrom to obtain a carbosilane-siloxane copolymer solution (A). A solid content of the obtained carbosilane-siloxane copolymer solution was 18 wt %, and a weight average molecular weight (Mw) of the carbosilane-siloxane copolymer in terms of a polystyrene standard sample, which was measured by using GPC, was 3,785 g/mol. The weight average molecular weight (Mw) was measured by using gel permeation chromatograph (GPC: HLC-8220GPC, Torso Com. Ltd.).

Examples 1 to 4 and Comparative Examples 1 to 4: Preparation of Curable Resin Composition Carbosilane-siloxane copolymer obtained from the Synthesis Example, propylene glycol methyl ether acetate (PGMEA) as a solvent, and hollow silica particles having an average $D_{50}$ of 100 nanometers (nm) (Advanced Nano Products Cor. Silica content of 20 wt %); and a surfactant containing fluorine, F-563 (DOC Cor.) were mixed together in amounts based on a total weight of the composition described in Table 1 below to form curable resin compositions according to Examples 1 to 4, and Comparative Examples 1 to 4. In this case, the hollow silica particles had the maximum peak value in the Q4 region, as described in Table 1 below, based on 100% of the maximum peak value of the Q3 region, as measured by Si-NMR analysis.

Manufacture of Cured Film and Evaluation

The compositions according to Examples 1 to 4 and Comparative Examples 1 to 4 were respectively coated on a substrate to form a cured film to evaluate refractive index, contact angle with respect to water, and adhesion force to a layer deposited thereon. In this case, a thickness of each of the cured films was measured by using Alpha-step (Surface profiler KLA, Tencor Cor.).

Method of manufacturing the cured films and measurement methods are as below.

(1) Refractive Index

Each of the compositions of Examples 1 to 4 and Comparative Examples 1 to 4 were coated on a silicon wafer having a diameter of 4 inches by using a spin coater (Mikasa Cor. Opticoat MS-A100) at 200 rpm (rotations per minute) for 10 minutes, and prebaked on a hot-plate at 100° C. for 2 minutes to obtain a film. Then, the films were dried and cured at 230° C. for 20 minutes to obtain cured films each having a thickness of 2.0 μm. Then, the obtained cured films were measured for refractive index by using a spectroscopic ellipsometer (Ellipsometer Base-160, J.A. Woollam Co.), and the results were shown in Table 1.

(2) Contact Angle

Each of the compositions of Examples 1 to 4 and Comparative Examples 1 to 4 were coated on a glass substrate by using a spin coater (Mikasa Corp. Opticoat MS-A100) at 200 rpm (rotations per minute) for 10 minutes, and prebaked on a hot-plate at 100° C. for 2 minutes to obtain a film. Then, the films were dried and cured at 230° C. for 20 minutes to obtain cured films each having a thickness of 2.0 μm. Then, 3 microliters (μl) of distilled water (DI water) was dropped on each of the films, and contact angle of the water on the films were measured by using DSA-100 (KRUSS Com. Ltd.). The results are shown in Table 1.

(3) Adhesion Force

Each of the compositions of Examples 1 to 4 and Comparative Examples 1 to 4 were coated on a silicon wafer having a diameter of 6 inches by using a spin coater (Mikasa Cor. Opticoat MS-A100) at 200 rpm (rotations per minute) for 10 minutes, and prebaked on a hot-plate at 100° C. for 2 minutes to obtain a film. Then, the films were dried and cured at 230° C. for 20 minutes to obtain cured films each having a thickness of 2.0 μm. Subsequently, $SiO_x$ upper layers were formed on each of the cured films by using a Chemical Vapor Deposition apparatus for plasma enhanced chemical vapor deposition (PE-CVD). Then, the upper layers were cross-cut to a size of 15 mm in length, 15 mm width, and 100 μm in depth, attached with a testing tape having an adhesion force of 4.5 N/m, and detached from the testing tape to evaluate the adhesion force of each cured film according to ASTM D3359 International Standard Test Method. In accordance with the definition of evaluation values of ASTM D3359, the ratio of area delaminated was shown as adhesion index as described below:

Adhesion Index

0B: 100% delaminated (entirely delaminated)
1B: 80% delaminated
2B: 60% delaminated
3B: 40% delaminated
4B: 20% delaminated
5B: 0% delaminated (not delaminated)

TABLE 1

|  | Q4 peak/ Q3 peak (%) | Composition (wt %) | | | | Properties of Cured films | | |
|---|---|---|---|---|---|---|---|---|
|  |  | Carbosilane-Siloxane Copolymer | Hollow Silica particles | Solvent | Surfactant | Refractive index | Contact Angle (°) | Adhesion Index |
| Example 1 | 200 | 32 | 25 | 42 | 1 | 1.229 | 113 | 5B |
| Example 2 |  | 30 | 27 | 42 | 1 | 1.226 | 108 | 5B |
| Example 3 |  | 29 | 29 | 41 | 1 | 1.218 | 105 | 4~5B |
| Example 4 | 206 | 32 | 25 | 42 | 1 | 1.229 | 116 | 5B |
| Comparative Example 1 | 160 | 47 | 10 | 42 | 1 | 1.329 | 102 | 3B |
| Comparative Example 2 |  | 32 | 25 | 42 | 1 | 1.224 | 98 | 0B |
| Comparative Example 3 |  | 29 | 29 | 41 | 1 | 1.217 | 94 | 0B |
| Comparative Example 4 | 135 | 47 | 10 | 42 | 1 | 1.341 | 100 | 1~2B |

Referring to Table 1, the cured films of Examples 1 to 4 formed of the compositions including hollow silica particles of which the ratio of the maximum peak value in the Q4 region is greater than or equal to two times (e.g., greater than or equal to 200%) that in the Q3 region have a low refractive index of less than or equal to 1.3, a high contact angle of greater than or equal to 105°, and an adhesion index of at least 4B, and nearly 5B, e.g., is hardly delaminated. That is, the cured films have strong adhesion force to the upper layer at a thickness of the micrometer level as in the Examples and Comparative Examples.

On the contrary, the cured films of Comparative Examples 1 to 4 formed of the compositions including hollow silica particles of which the ratio of the maximum peak value in the Q4 region is less than two times (e.g., less than 200%) that in the Q3 region have a similar low refractive index of less than or equal to 1.3 when the amount of the hollow silica particles is equivalent to the cured films of Examples (e.g., in case of Comparative Examples 2 and 3), while all of their contact angles of water are low and less than 100°, and in this case, all of the adhesion indices of the cured films according to Comparative Examples 1 to 4 are 0B, e.g., all of the upper layers were entirely delaminated. For example, when including the same amount of the hollow silica particles, if the maximum peak ratio of Q4/Q3 is less than 2, the adhesion force of the upper layer significantly deteriorates (e.g., is significantly reduced). On the contrary, when the amount of the same hollow silica particles as those of Comparative Examples 2 and 3 is significantly decreased in Comparative Example 1, the adhesion index was 3B. For example, the adhesion index of Comparative Example 1 was improved by lowering the amount of the hollow silica particles which are also contained in the films of Comparative Examples 2 and 3.

When including hollow silica particles to decrease refractive index, if the hollow silica has a maximum peak ratio of Q4/Q3 that is less than 2, as the amount of the hollow silica particles increases, adhesion force deteriorates (e.g., is significantly reduced). However, according to the Examples of the present disclosure, if the hollow silica has a maximum peak ratio of Q4/Q3 that is greater than or equal to 2, as the amount of the hollow silica particles increases, refractive index decreases, and adhesion force increases, which is a surprising effect of the subject matter of the present disclosure in which refractive index decreases, while not deteriorating adhesion force. In Comparative Example 4, the cured films have strong adhesion force to the upper layer at a thickness of a micrometer level as in the Examples and Comparative Examples, and when the ratio of a maximum peak value of Q4/Q3 of the hollow silica particles is far lower, even though the amount of the hollow silica particles is the same as in Comparative Example 1, refractive index further increases, and adhesion force further deteriorates.

As described above, a composition comprising hollow silica particles of which the ratio of the maximum peak value in the Q4 region is greater than or equal to two times (e.g., greater than or equal to 200%) that in the Q3 region may maintain a low refractive index, while having improved adhesion force to an upper layer, and thus, the cured film prepared from the composition may advantageously be used in various suitable electronic devices for lowering refractive index.

Hereinbefore, example embodiments of the present disclosure have been described and illustrated, however, it should be apparent to a person having ordinary skill in the art that the subject matter of the present disclosure is not limited to the example embodiments as described, and may be variously modified and transformed without departing from the spirit and scope of the present disclosure. Accordingly, the modified or transformed example embodiments as such may not be understood as being separate from the technical ideas and aspects of the described embodiments of the present disclosure, and the modified example embodiments are within the scope of the claims of the present disclosure, and equivalents thereof.

| Description of Symbols | |
|---|---|
| 100: color conversion panel | 110: substrate |
| 112: protective layer | 120: low refractive layer |
| 130: color conversion layer | 132: first color conversion member |
| 133: first quantum dot | 134: second color conversion member |
| 135: second quantum dot | 136: transmitting member |
| 140: planarization layer | 150: first capping layer |
| 160: second capping layer | A: first region |
| B: second region | C: third region |

What is claimed is:

1. A curable resin composition comprising:
a silicon-containing polymer;
aluminosilicate hollow silica particles having greater than or equal to two times higher a maximum peak value in a Q4 region than that in a Q3 region, as measured by silicon nuclear magnetic resonance spectroscopy (Si-NMR) analysis; and
a solvent.

2. The curable resin composition according to claim 1, wherein the silicon-containing polymer comprises a carbosilane-siloxane copolymer represented by Chemical Formula 1:

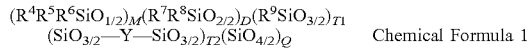
$$(R^4R^5R^6SiO_{1/2})_M(R^7R^8SiO_{2/2})_D(R^9SiO_{3/2})_{T1}(SiO_{3/2}-Y-SiO_{3/2})_{T2}(SiO_{4/2})_Q \quad \text{Chemical Formula 1}$$

wherein, in Chemical Formula 1, $R^4$ to $R^9$ are independently hydrogen, a substituted or unsubstituted $C^1$ to $C^{30}$ alkyl group, a substituted or unsubstituted $C^2$ to $C^{30}$ alkenyl group, a substituted or unsubstituted $C^2$ to $C^{30}$ alkynyl group, a substituted or unsubstituted $C^1$ to $C^{30}$ heteroalkyl group, a substituted or unsubstituted $C^6$ to $C^{30}$ aryl group, a substituted or unsubstituted $C^3$ to $C^{30}$ cycloalkyl group, a substituted or unsubstituted $C^2$ to $C^{30}$ heterocycloalkyl group, a substituted or unsubstituted $C^1$ to $C^{30}$ alkoxyl group, carboxyl group, R(C=O), R(=O)O-(wherein, R is hydrogen, a $C^1$ to $C^{30}$ alkyl group, a $C^3$ to $C^{30}$ cycloalkyl group, a $C^6$ to $C^{30}$ aryl group, or a combination thereof), an epoxy-containing monovalent organic group, a (meth)acrylic group, a (meth)acrylate group, or a combination thereof, Y is a substituted or unsubstituted $C^1$ to $C^{30}$ alkylene group, a substituted or unsubstituted $C^2$ to $C^{30}$ alkenylene group, a substituted or unsubstituted $C^3$ to $C^{30}$ cycloalkylene group, a substituted or unsubstituted $C^6$ to $C^{30}$ arylene group, or a combination thereof, and $0 \leq M \leq 0.5$, $0 \leq D \leq 0.5$, $0 < T1 \leq 0.95$, $0 < T2 \leq 0.2$, $0 < Q \leq 0.95$, provided that $M+D+T1+T2+Q=1$.

3. The curable resin composition according to claim 2, wherein in Chemical Formula 1, $M=0$, $0 \leq D \leq 0.2$, $0 < T1 < 0.5$, $0 < T2 < 0.2$, $0.5 \leq Q \leq 0.95$, and $D+T1+T2+Q=1$.

4. The curable resin composition according to claim 2, wherein in Chemical Formula 1, $M=0$, $D=0$, $0 < T1 < 0.4$, $0 < T2 < 0.2$, $0.6 \leq Q \leq 0.9$, and $T1+T2+Q=1$.

5. The curable resin composition according to claim 1, wherein a weight average molecular weight (Mw) of the silicon-containing polymer is 1,000 to 100,000 g/mol in terms of a polystyrene standard sample.

6. The curable resin composition according to claim 1, wherein an amount of the silicon-containing polymer is 1 weight % to 30 weight % based on a total weight of the curable resin composition.

7. The curable resin composition according to claim 1, wherein the curable resin composition further comprises an organic polymer having a boiling point of from 100° C. to 250° C.

8. The curable resin composition according to claim 7, wherein the organic polymer comprises a polyalkylene oxide copolymer, a polyarylene oxide copolymer, a glycol copolymer, or a combination thereof.

9. The curable resin composition according to claim 7, wherein the organic polymer has a number average molecular weight (Mn) of 100 g/mol to 10,000 g/mol.

10. The curable resin composition according to claim 7, wherein an amount of the organic polymer is 0.1 weight % to 10 weight % based on a total weight of the curable resin composition.

11. The curable resin composition according to claim 1, wherein an average diameter ($D_{50}$) of the hollow silica particles is 10 nanometers (nm) to 300 nm.

12. The curable resin composition according to claim 1, wherein an average porosity of the hollow silica particles is 40% to 90%.

13. The curable resin composition according to claim 1, wherein an amount of the hollow silica particles is 0.1 weight % to 15 weight % based on a total weight of the curable resin composition.

14. The curable resin composition according to claim 1, wherein the curable resin composition further comprises a surface modifying additive comprising a fluorine-based surfactant.

15. A thin film prepared by curing the curable resin composition according to claim 1.

16. The thin film according to claim 15, wherein the film has a refractive index of less than or equal to 1.35 with respect to light having a wavelength of 500 nm to 550 nm, and a water contact angle of greater than or equal to 105°.

17. A color conversion panel comprising the thin film according to claim 15.

18. A display device comprising the color conversion panel according to claim 17.

* * * * *